(12) United States Patent
Hwang et al.

(10) Patent No.: US 9,324,944 B2
(45) Date of Patent: Apr. 26, 2016

(54) SELECTION DEVICE AND NONVOLATILE MEMORY CELL INCLUDING THE SAME AND METHOD OF FABRICATING THE SAME

(71) Applicants: Hyunsang Hwang, Gwangju (KR); WooTae Lee, Gwangju (KR)

(72) Inventors: Hyunsang Hwang, Gwangju (KR); WooTae Lee, Gwangju (KR)

(73) Assignee: GWANGJU INSTITUTE OF SCIENCE AND TECHNOLOGY, Buk-Gu, Gwangju (KR)

( * ) Notice: Subject to any disclaimer, the term of this patent is extended or adjusted under 35 U.S.C. 154(b) by 177 days.

(21) Appl. No.: 13/856,838

(22) Filed: Apr. 4, 2013

(65) Prior Publication Data

US 2013/0264534 A1    Oct. 10, 2013

(30) Foreign Application Priority Data

Apr. 4, 2012   (KR) .................. 10-2012-0035121

(51) Int. Cl.
*H01L 45/00* (2006.01)
*H01L 27/24* (2006.01)

(52) U.S. Cl.
CPC .......... *H01L 45/145* (2013.01); *H01L 27/2418* (2013.01); *H01L 45/00* (2013.01); *H01L 45/08* (2013.01); *H01L 45/1233* (2013.01); *H01L 45/146* (2013.01); *H01L 45/147* (2013.01)

(58) Field of Classification Search
None
See application file for complete search history.

(56) References Cited

U.S. PATENT DOCUMENTS

2007/0117256 A1*  5/2007  Stewart et al. .................. 438/99
2012/0068137 A1*  3/2012  Hwang et al. ..................... 257/2

* cited by examiner

*Primary Examiner* — Robert Bachner
*Assistant Examiner* — Molly Reida
(74) *Attorney, Agent, or Firm* — Nath, Goldberg & Meyer; Joshua B. Goldberg; Christopher Thomas

(57) ABSTRACT

A selection device, non-volatile memory cell, and method of fabricating the same. The selection device employs an oxide laminate structure including a tunneling oxide layer and a metal-cluster oxide layer between first and second electrodes, enabling a high selection ratio and sufficient on-current density to allow program data recordation in a memory cell at relatively low voltage. The non-volatile memory cell includes the selection device electrically connected to a resistive random access memory device, including a resistance change layer, enabling suppression of current leakage from a non-selected adjacent memory cell in an array structure. In the method of fabrication, a tunneling oxide layer is formed by depositing and oxidizing a metal layer to control oxygen vacancy density in the metal-cluster oxide layer, and an interface oxide layer is formed in the tunneling oxide layer by doping of metal-clusters in the metal-cluster oxide layer, improving on-current density of the selection device.

10 Claims, 17 Drawing Sheets

SELECTION DEVICE AND NONVOLATILE MEMORY CELL INCLUDING THE SAME AND METHOD OF FABRICATING THE SAME

CROSS-REFERENCE TO RELATED APPLICATION

This application claims priority to Korean Patent Application No. 10-2012-0035121 filed on 4 Apr., 2012 and all the benefits accruing therefrom under 35 U.S.C. §119, the contents of which are incorporated by reference in their entirety.

BACKGROUND

1. Technical Field

The present invention relates to a selection device, and more particularly, to a selection device for non-volatile memory.

2. Description of the Related Art

Recently, a resistive random access memory (RRAM), which is a non-volatile memory, has attracted attention due to its various advantages, such as simple structure, low power consumption, high integrity, excellent availability, rapid switching rate, and the like.

In particular, a bipolar RRAM has excellent switching uniformity and memory characteristics and thus has been actively investigated.

Recently, a cross-point array structure has been broadly used to realize high integration of a resistive random access memory. In the cross-point array structure, word lines and bit lines are formed to cross at a right angle and a resistive random access memory cell is disposed at each cross point therebetween. However, the cross-point array structure can suffer from current leakage such as sneak path current through an adjacent memory cell which is not selected. The sneak path current generates interference in a reading operation, thereby causing misreading and increase in power consumption. As a technique for suppressing current leakage such as sneak path current, a selection device has been suggested. First, as a selection device, use of a diode such as a p-n junction diode, a Schottky diode, and the like was proposed. However, the diode-based selection device allows a significantly low current to pass through the diode in a reverse-bias state, and thus cannot be used as the selection device in a bipolar resistive random access memory.

In addition, a Ni/TiO$_2$/Ni structure including an oxide monolayer was proposed as the selection device. However, the oxide monolayer selection device has a low on-current density of about $10^5$ A/cm$^2$, thereby making it difficult to record data on the resistive random access memory.

BRIEF SUMMARY

An aspect of the present invention is to provide a selection device, which employs a multilayered oxide laminate structure including a tunneling oxide layer and a metal cluster oxide layer to have a sufficient on-current density and a high selection ratio so as to allow data recording on a memory at a relatively low voltage.

In accordance with one aspect of the present invention, a selection device for a non-volatile memory is provided. The selection device includes a first electrode; a second electrode; a tunneling oxide layer interposed between the first electrode and the second electrode; and a metal cluster oxide layer interposed between the tunneling oxide layer and the first electrode and/or between the tunneling oxide layer and the second electrode, wherein the tunneling oxide layer includes an insulating oxide layer, and an interface oxide layer formed by doping of a metal contained in the metal cluster oxide layer into the tunneling oxide layer to adjoin the metal cluster oxide layer.

The interface oxide layer may be an oxide layer formed by doping of a metal having a different valence electron number than that of the metal of the tunneling oxide layer.

The insulating oxide layer may have a higher work function than the metal cluster oxide layer, or the same as that of the metal cluster oxide layer.

In accordance with another aspect of the present invention, a unit memory cell is provided. The unit memory cell includes a selection device including a tunneling oxide layer and a metal cluster oxide layer; and a resistive random access memory device electrically connected to the selection device and including a resistance change layer.

The selection device may further include a reactive metal electrode on the metal cluster oxide layer. The reactive metal electrode may contain a metal having an electronegativity of 1.0 eV to 1.5 eV.

The resistance change layer may be formed at an interface between the metal cluster oxide layer and the reactive metal electrode.

In accordance with a further aspect of the present invention, a method of fabricating a selection device for a non-volatile memory is provided. The method includes: forming a first electrode; forming a tunneling oxide layer on the first electrode; forming a second electrode on the tunneling oxide layer; and forming a metal cluster oxide layer between the first electrode and the tunneling oxide layer and/or between the tunneling oxide layer and the second electrode.

The tunneling oxide layer may be formed by atomic layer deposition (ALD), and the metal cluster oxide layer may be formed by depositing a metal layer, followed by oxidizing the metal layer.

The present invention is not limited to the above aspects, and other aspects, objects, features and advantages of the present invention will become apparent to those skilled in the art from the following description.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Figure 1:
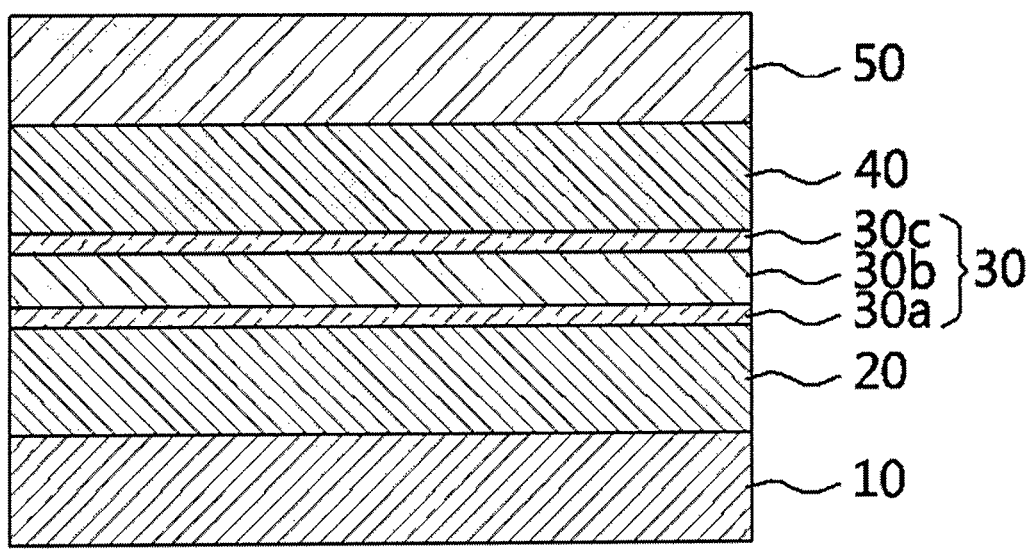
FIG. 1 is a sectional view of a selection device for a non-volatile memory in accordance with one embodiment of the present invention.

Exemplary embodiments of the present invention will now be described in detail with reference to the accompanying drawings. However, it should be understood that the present invention is not limited to the following embodiments and may be embodied in different ways by those skilled in the art without departing from the scope of the present invention. Further, it should be understood that various modifications and equivalent embodiments may be made by those skilled in the art without departing from the spirit and scope of the present invention.

It will be understood that when a layer is referred to as being "on" another layer or substrate, it can be directly formed on the other layer or substrate, or an intervening layer(s) may also be present. In addition, spatially relative terms, such as "above," "upper (portion)," "upper surface," and the like may be understood as meaning "below," "lower (portion)," "lower surface," and the like according to a reference orientation. In other words, the expressions of spatial orientations are to be construed as indicating relative orientations instead of absolute orientations.

In the drawings, the thicknesses of layers and regions can be exaggerated or omitted for clarity. Like components will be denoted by like reference numerals throughout this specification.

FIG. 1 is a sectional view of a selection device for a non-volatile memory in accordance with one embodiment of the present invention.

Referring to FIG. 1, a first electrode 10, a first metal cluster oxide layer 20, a tunneling oxide layer 30, a second metal cluster oxide layer 40, and a second electrode 50 are sequentially stacked one above another.

The first electrode 10 may contain a metal. The metal may be selected from the group consisting of Pt, Ag, Cu, Au, Al, Sm, Ti, W, and alloys thereof The first metal cluster oxide layer 20 may be disposed on the first electrode 10. The first metal cluster oxide layer 20 may be a metal oxide layer and may further contain metal clusters. Here, the first metal cluster oxide layer 20 may have a composition that does not satisfy a stoichiometric relationship. That is, the first metal cluster oxide layer 20 may be a non-stoichiometric layer.

The first metal cluster oxide layer 20 has a high oxygen vacancy density. Thus, the first metal cluster oxide layer 20 is richer in metal than in oxygen, and thus can supply metal ions to the tunneling oxide layer 30.

Further, the metal clusters are randomly distributed inside the first metal cluster oxide layer 20. Thus, the first metal cluster oxide layer 20 may act as an internal resistor. In other words, the first metal cluster oxide layer 20 may act as a resistor inside the selection device to prevent electric current over self-compliance current. As a result, the device has improved durability.

The first metal cluster oxide layer 20 may contain, for example, $TaO_x$, $TiO_x$ or $HfO_x$ ($0.1 \leq X \leq 1$).

The tunneling oxide layer 30 may be disposed on the first metal cluster oxide layer 20. The tunneling oxide layer 30 may include a first interface oxide layer 30a, an insulating oxide layer 30b, and a second interface oxide layer 30b.

The tunneling oxide layer 30 may contain a metal oxide. For example, the metal oxide may include $TiO_2$, $Al_2O_3$ or $HfO_2$.

The first interface oxide layer 30a may be formed by doping of a metal contained in the first metal cluster oxide layer 20 into the tunneling oxide layer 30. Here, the first interface oxide layer 30a may adjoin the first metal cluster oxide layer 20.

In one embodiment, the first interface oxide layer 30a may be formed by supply of metal ions contained in a relatively sufficient amount in the first metal cluster oxide layer 20 into the tunneling oxide layer 30. The metal ions of the first metal cluster oxide layer 20 may replace the metal ions in the tunneling oxide layer 30. Here, the metal ions of the first metal cluster oxide layer 20 may have an ion size capable of replacing the metal ions of the tunneling oxide layer 30.

On the periodic table, the group of the metal element contained in the tunneling oxide layer 30 may be adjacent the group of the metal element contained in the first metal cluster oxide layer 20. For example, if the metal element contained in the tunneling oxide layer 30 belongs to Group III, the metal element contained in the first metal cluster oxide layer 20 may be selected from metal elements belonging to Group II or IV.

Further, the metal ions of the first metal cluster oxide layer 20 may have a different valence electron number than that of the metal ions of the tunneling oxide layer 30. For example, the metal ions of the first metal cluster oxide layer 20 may have a greater valence electron number than the metal ions of the tunneling oxide layer 30. Thus, in the first interface oxide layer 30a, the metal ions of the first metal cluster oxide layer 20 may occupy the sites of the metal ions of the tunneling oxide layer 30 to generate electrons. As a result, the first interface oxide layer 30a may be an n-type semiconductor layer. On the contrary, the metal ions of the first metal cluster oxide layer 20 may have a smaller valence electron number than that of the metal ions of the tunneling oxide layer 30. In this case, the first interface oxide layer 30a may be a p-type semiconductor layer.

As described above, the first interface oxide layer 30a may be an oxide layer formed by doping of metal ions having a different valence electron number than that of the metal ions of the tunneling oxide layer 30.

The insulating oxide layer 30b may have a composition which satisfies a stoichiometric relationship. That is, the insulating oxide layer 30b may be a stoichiometric layer which has a very low oxygen vacancy density. Thus, the insulating oxide layer 30b may have high insulating properties.

The insulating oxide layer 30b may have a thickness of 10 nm or less in order to allow F—N tunneling of electrons at a predetermined voltage or more.

The thickness of the insulating oxide layer 30b may decrease with increasing thickness of the first interface oxide layer 30a. That is, the thickness of the insulating oxide layer 30b may depend on the thickness of the first interface oxide layer 30a. Here, when the thickness of the insulating oxide layer 30b is reduced to a predetermined value or less, on-current density can be increased by F—N tunneling of electrons.

Since the first interface oxide layer 30a adjoins the insulating oxide layer 30b, the first interface oxide layer 30a can bend an energy band of the insulating oxide layer 30b. Thus, when a predetermined voltage or more is applied to the device, F—N tunneling of electrons occurs, thereby increasing on-current density.

The second metal cluster oxide layer 40 may be disposed on the tunneling oxide layer 30. In addition, the second interface oxide layer 30c may be formed by doping of metal ions contained in the second metal cluster oxide layer 40 into the tunneling oxide layer 30.

The second metal cluster oxide layer 40 has the same structure as that of the first metal cluster oxide layer 20 described above, and the second interface oxide layer 30c has the same structure as that of the first interface oxide layer 30a described above. Thus, detailed descriptions thereof will be omitted herein.

The second electrode 50 may be disposed on the second metal cluster oxide layer 40. The second electrode 50 has the same structure as that of the first electrode 10, and thus a detailed description thereof will be omitted herein.

Although the metal cluster oxide layers 20, 40 are illustrated as being disposed between the tunneling oxide layer 30 and the first electrode 10 and between the tunneling oxide layer 30 and the second electrode 40, respectively, the present invention is not limited thereto.

Figure 2:
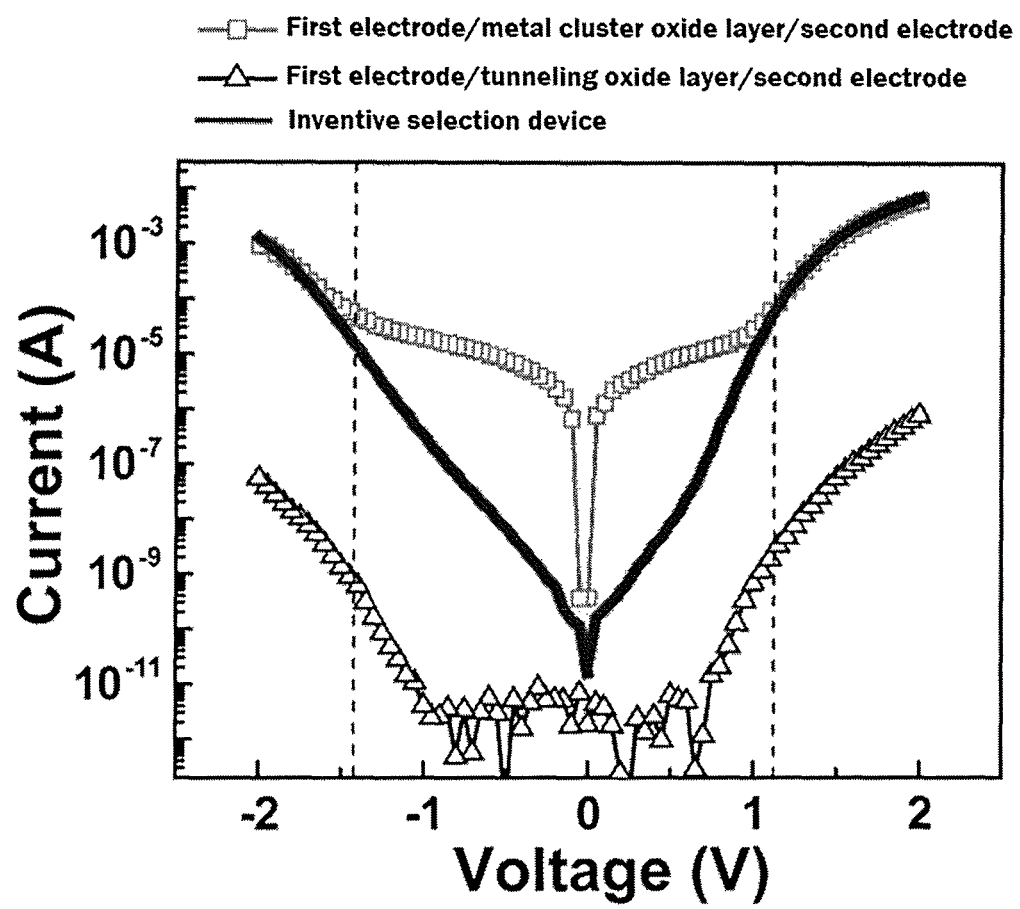
FIG. 2 is a current-voltage (I-V) curve of a selection device for a non-volatile memory in accordance with one embodiment of the present invention.

FIG. 2 is a current-voltage (I-V) curve of a selection device for a non-volatile memory in accordance with one embodiment of the present invention.

Referring to FIG. 2, in the structure in which only the tunneling oxide layer is interposed between the first electrode and the second electrode, that is, in the first electrode/tunneling oxide layer/second electrode structure, the tunneling oxide layer exhibits high insulation properties upon turn on at about 0.7 V. Thus, it can be confirmed that the selection device has a very low on-current and a relatively good selection ratio, which can be defined as a ratio of on-current to off-current.

In the structure in which only the metal cluster oxide layer is interposed between the first electrode and the second electrode, that is, in the first electrode/metal cluster oxide layer/second electrode structure, it can be confirmed that the selection device has a very high on-current upon turn on at about 0.7 V, and a very low selection ratio.

It can be confirmed that the selection device according to the present invention has high on-current upon turn-on at about 0.7 V and a high selection ratio by expressing a very steep increase of electric current after turn-on.

Further, it can be confirmed that the current of the selection device of the present invention is saturated at voltages not in the range of −1.4~1.1 V. It is understood that this result is obtained by the metal cluster oxide layer acting as a resistor inside the selection device. As a result, the selection device is prevented from breaking down, thereby improving durability.

Figure 3A:
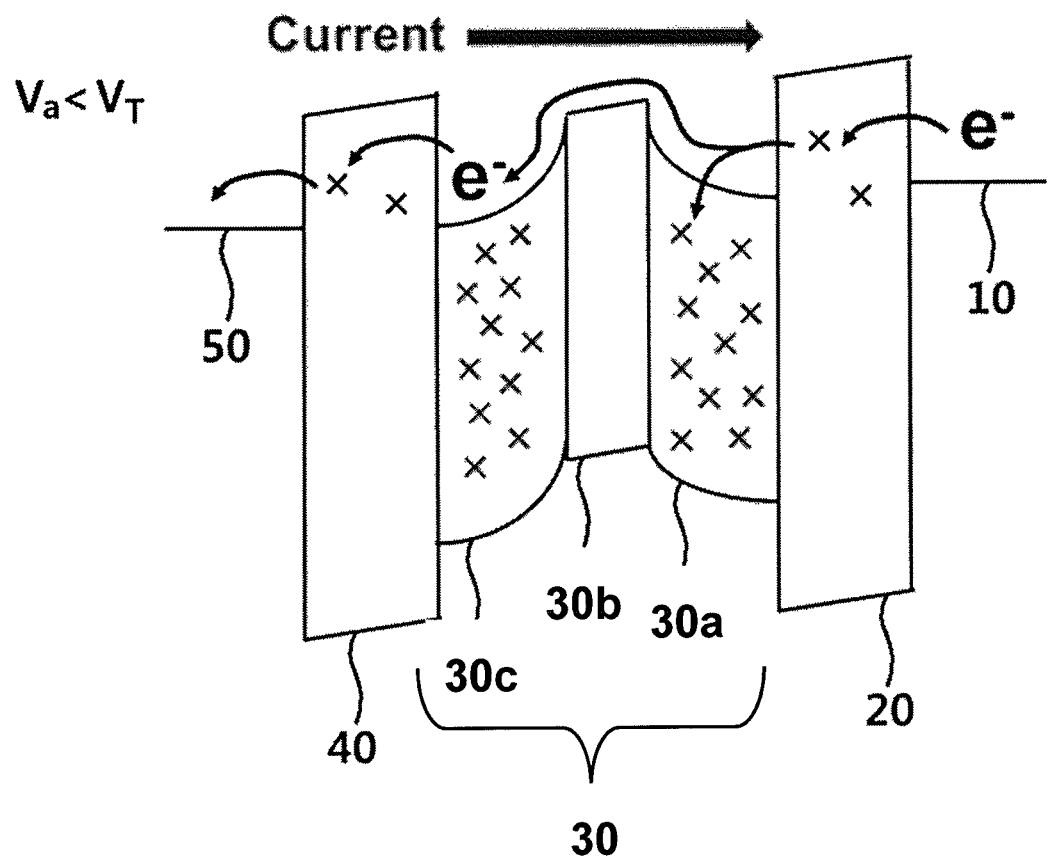
FIGS. 3a and 3b are schematic diagrams illustrating a conduction mechanism of a selection device for a non-volatile memory in accordance with one embodiment of the present invention.
Figure 3B:
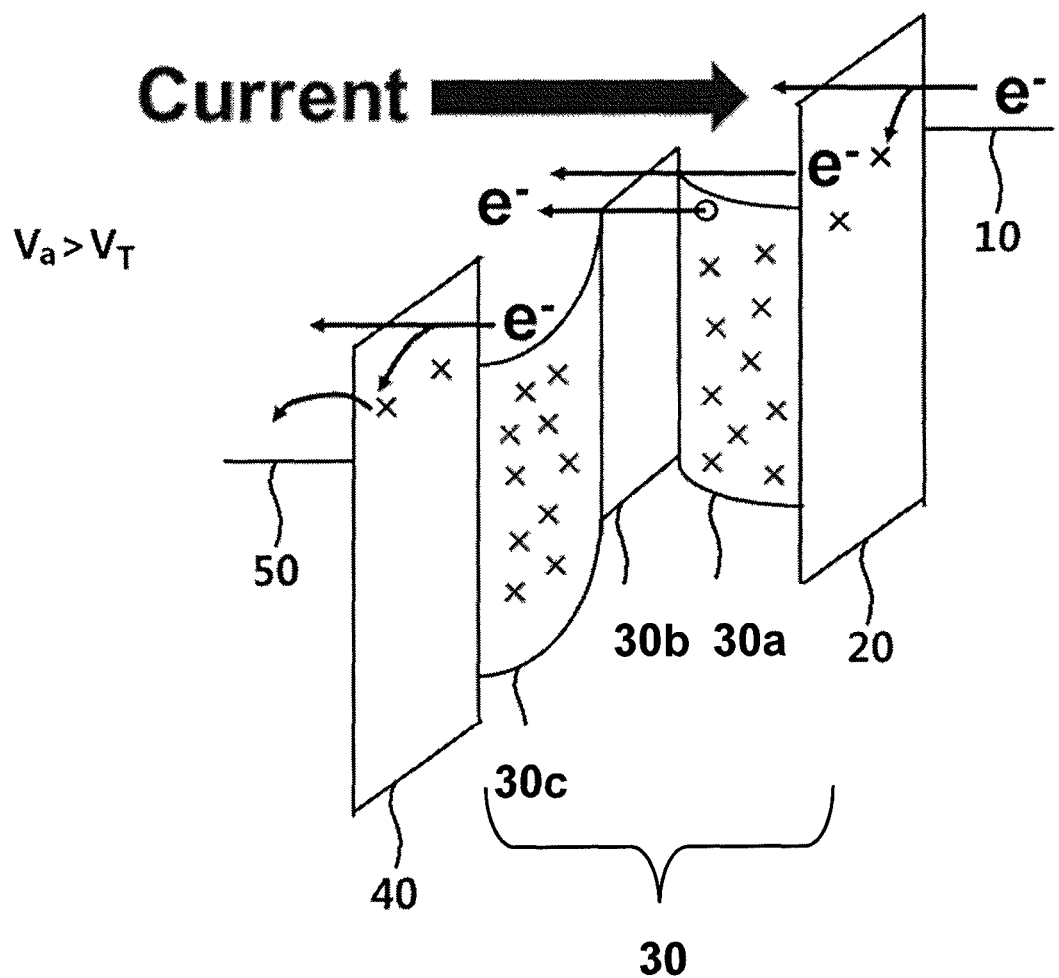

FIGS. 3a and 3b are schematic diagrams illustrating a conduction mechanism of a selection device for a non-volatile memory in accordance with one embodiment of the present invention.

Referring to FIGS. 2 and 3a, when voltage applied to the selection device is less than tunneling voltage ($V_T$) ($V_a<V_T$), for example, at an applied voltage $V_a$ of less than 0.7 V, a relatively weak electric field is generated in the first electrode 10. Thus, since it is difficult for electrons of the first interface oxide layer 30a to overcome the energy barrier of the insulating oxide layer 30b, electric current is low. As a result, it is possible to suppress current leakage in this voltage range.

Referring to FIGS. 2 and 3b, when voltage applied to the selection device is less than tunneling voltage ($V_T$) ($V_a>V_T$), for example, at an applied voltage ($V_a$) of greater than 0.7 V, since the first interface oxide layer 30a is an n-type semiconductor layer, electrons accumulated in the conduction band of the first interface oxide layer 30a cause significant bending of the energy band of the insulating oxide layer 30b. As a result, F—N tunneling of electrons through the tunneling oxide layer 30 occurs, thereby allowing the device to be turned on and to exhibit relatively great increase in tunneling current.

Then, the first and second metal cluster oxide layers 20, 40 may act as internal resistors and prevent electric current exceeding self-compliance electric current at voltages not in a predetermined voltage range, for example, −1.4~1.1 V. Thus, the selection device may be prevented from breaking down. The self-compliance electric current may vary, as needed.

Further, the insulating oxide layer 30b may have the same or higher work function that the first and second metal cluster oxide layers 20, 40. In this case, the insulating oxide layer 30b has a decreased potential barrier, thereby decreasing tunneling voltage or increasing tunneling current.

FIGS. 4a to 4e are flow diagrams of a method of fabricating a selection device for a non-volatile memory in accordance with one embodiment of the present invention.

Figure 4A:
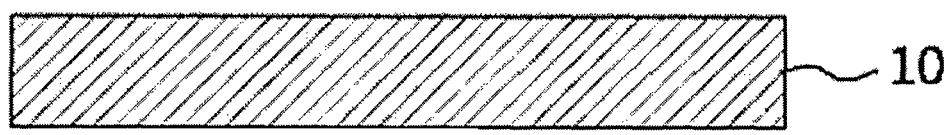
FIGS. 4a to 4e are flow diagrams of a method of fabricating a selection device for a non-volatile memory in accordance with one embodiment of the present invention.

Referring to FIG. 4a, a first electrode 10 is formed. In some embodiments, the first electrode 10 may be formed by depositing a metal. The metal may be selected from among Pt, Ag, Cu, Au, Al, Sm, Ti, W, and alloys thereof. The metal deposition may be carried out by sputtering, pulsed laser deposition, thermal evaporation, and the like.

Figure 4B:
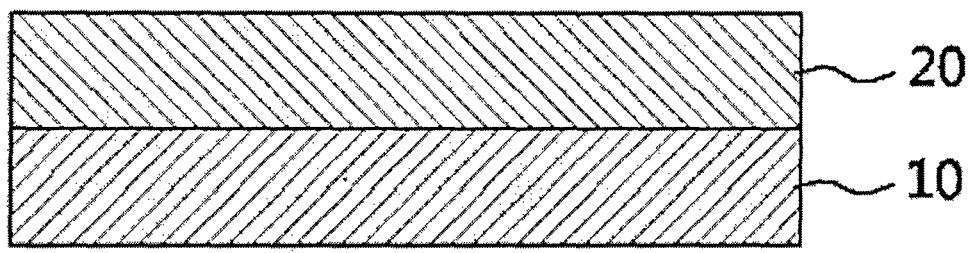

Referring to FIG. 4b, a first metal cluster oxide layer 20 is formed on the first electrode 10. In some embodiments, the first metal cluster oxide layer 20 may be formed by depositing a metal, followed by heat treatment in a furnace. The metal may be selected from among Ta, Ti and Hf, and may be oxidized by heat treatment. Oxygen vacancy density of the first metal cluster oxide layer 20 may be controlled by regulating process conditions of the heat treatment, such as temperature, time, and the like.

Figure 4C:
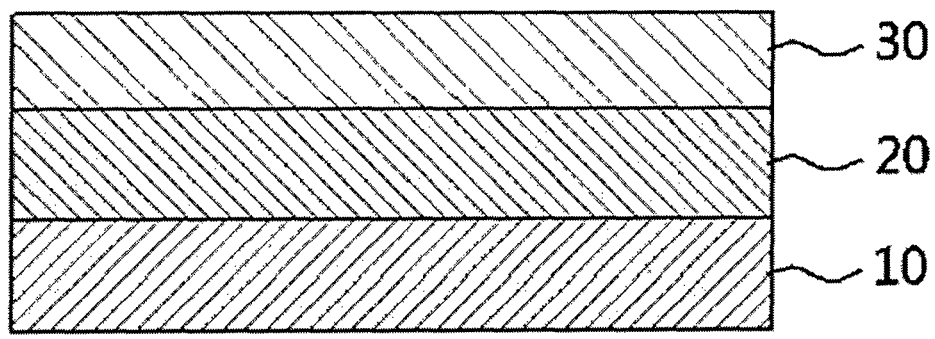

Referring to FIG. 4c, a tunneling oxide layer 30 is formed on the first metal cluster oxide layer 20. In some embodiments, the tunneling oxide layer 30 may contain $TiO_2$, $Al_2O_3$ or $HfO_2$. The tunneling oxide layer 30 may be deposited as a conformal layer in order to minimize generation of oxygen vacancies while maintaining high insulating characteristics.

For example, metal deposition may be carried out by chemical vapor deposition, atomic layer deposition, molecular beam epitaxy, and the like.

Figure 4D:
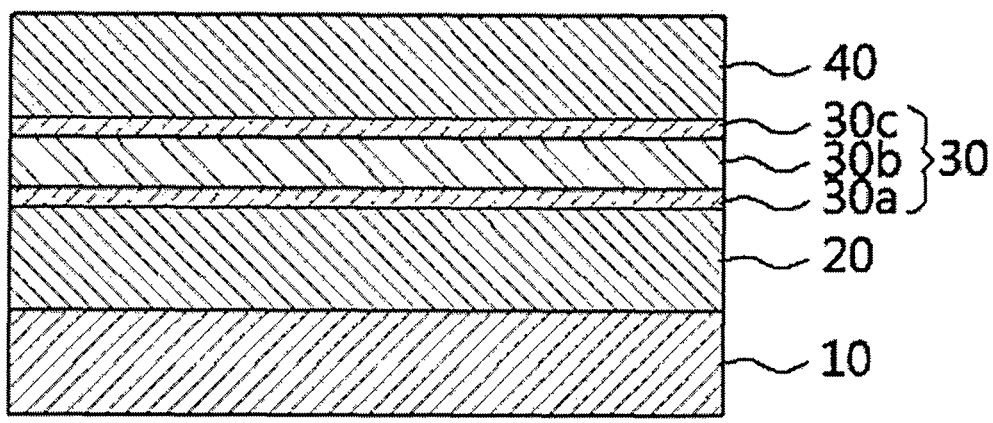

Referring to FIG. 4d, a second metal cluster oxide layer 40 is formed on the tunneling oxide layer 30.

The second metal cluster oxide layer 40 has the same structure as that of the first metal cluster oxide layer 20 and a detailed description thereof will be omitted. A first interface oxide layer 30a may be formed by doping of the metal contained in the first metal cluster oxide layer 20 into the tunneling oxide layer 30. For example, the first interface oxide layer 30a may be naturally formed by doping of metal ions contained in a relatively sufficient amount in the first metal cluster oxide layer 20 into the tunneling oxide layer 30.

Here, the thickness of the first interface oxide layer 30a may be varied according to replacement of the metal ions of the tunneling oxide layer 30 by the metal ions of the first metal cluster oxide layer 20. In addition, since the first interface oxide layer 30a is formed inside the tunneling oxide layer 30, the thickness of the insulating oxide layer 30b can be reduced by the thickness of the first interface oxide layer 20 formed in the tunneling oxide layer 30.

Figure 4E:
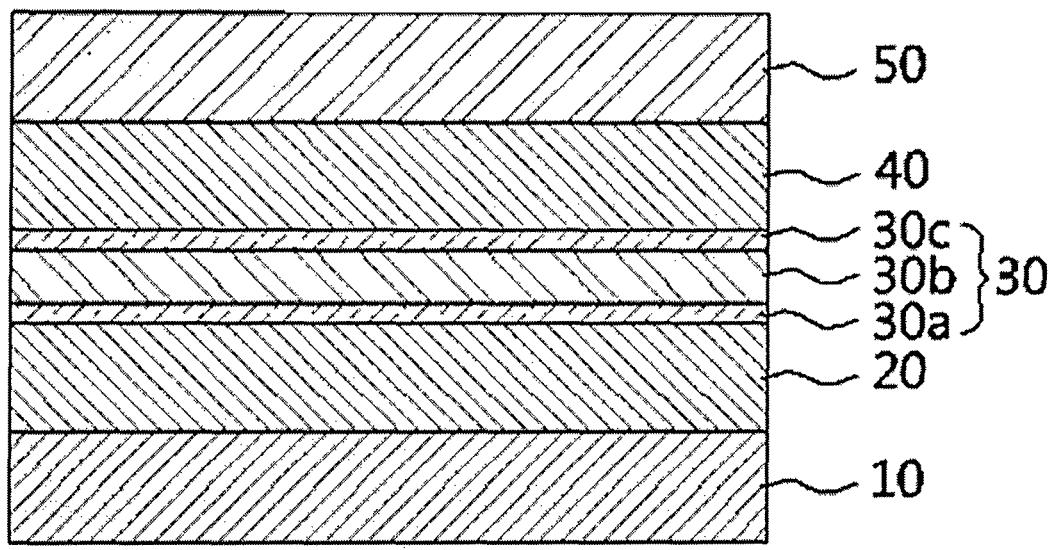

Similarly, a second interface oxide layer 30c may be formed by doping of metal ions contained in the tunneling oxide layer 30 into the second metal cluster oxide layer 40. The second interface oxide layer 30c has the same structure as that of the first interface oxide layer 30a described above, and a detailed description thereof will be omitted. Referring to FIG. 4e, a second electrode 50 is formed on the second metal cluster oxide layer 40. The second electrode 50 has the same structure as that of the first electrode 10 and thus a detailed description thereof will be omitted.

Next, the present invention will be described in more detail with reference to some examples. It should be understood that the following examples are provided for illustration only and are not to be construed in any way as limiting the scope of the present invention.

EXAMPLE

A Pt layer and a SiO$_2$ layer were sequentially deposited to form a first electrode and an interlayer insulation layer, respectively, followed by formation of via-holes having a diameter of 300 nm through lithography. Ta was deposited in the via-holes by sputtering, followed by annealing at 300° C. to form a TaO$_x$ layer (X=0.25). Then, a TiO$_2$ layer was deposited on the TaO$_x$ layer (X=0.25) by atomic layer deposition at 150° C., and Ta was deposited on the TiO$_2$ layer by sputtering, followed by annealing at 300° C. to form a TaO$_x$ layer (X=0.25). Next, Pt was deposited to form a second electrode.

Figure 5:
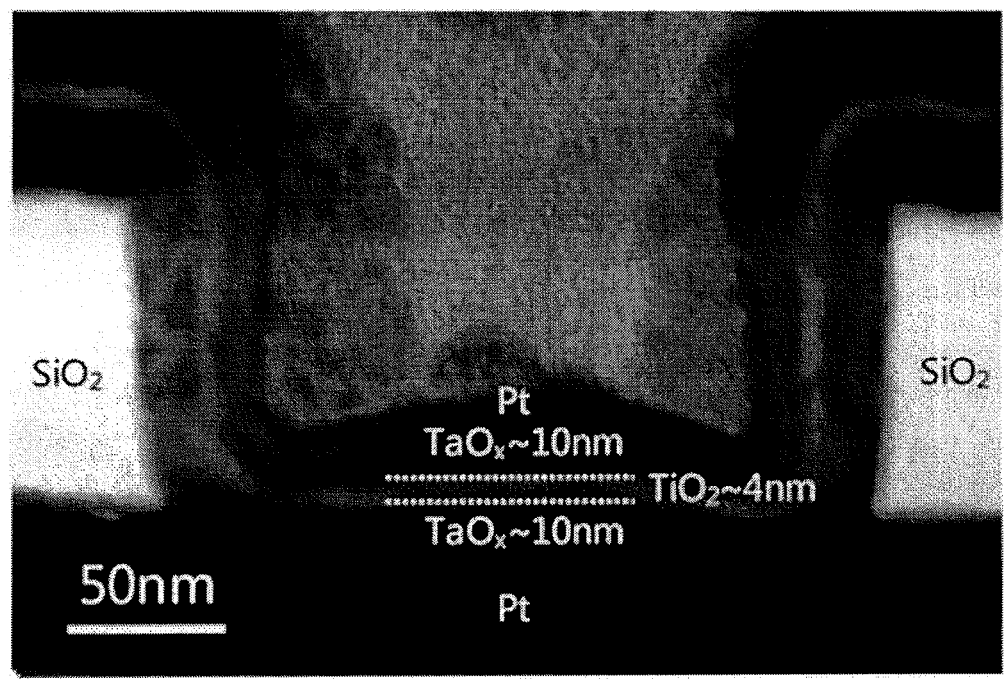
FIG. 5 is a TEM image of a selection device for a non-volatile memory in accordance with one embodiment of the present invention.

FIG. 5 is a TEM image of a selection device for a non-volatile memory in accordance with one embodiment of the present invention Referring to FIG. 5, it can be seen that a device is formed inside a via-hole having SiO$_2$ layers at both sides of the via-hole. The device has a laminated structure of Pt/TaO$_x$ (X=0.25)/TiO$_2$/TaO$_x$(X=0.25)/Pt, in which a 4 nm thick TiO$_2$ layer is formed between 10 nm thick TaO$_x$ layers.

Here, in the TiO$_2$ layer, Ta$^{5+}$ ions supplied from TaO$_x$ replace Ti$^{4+}$ ions, thereby forming a TiO$_2$ layer having oxygen vacancies.

Figure 6:
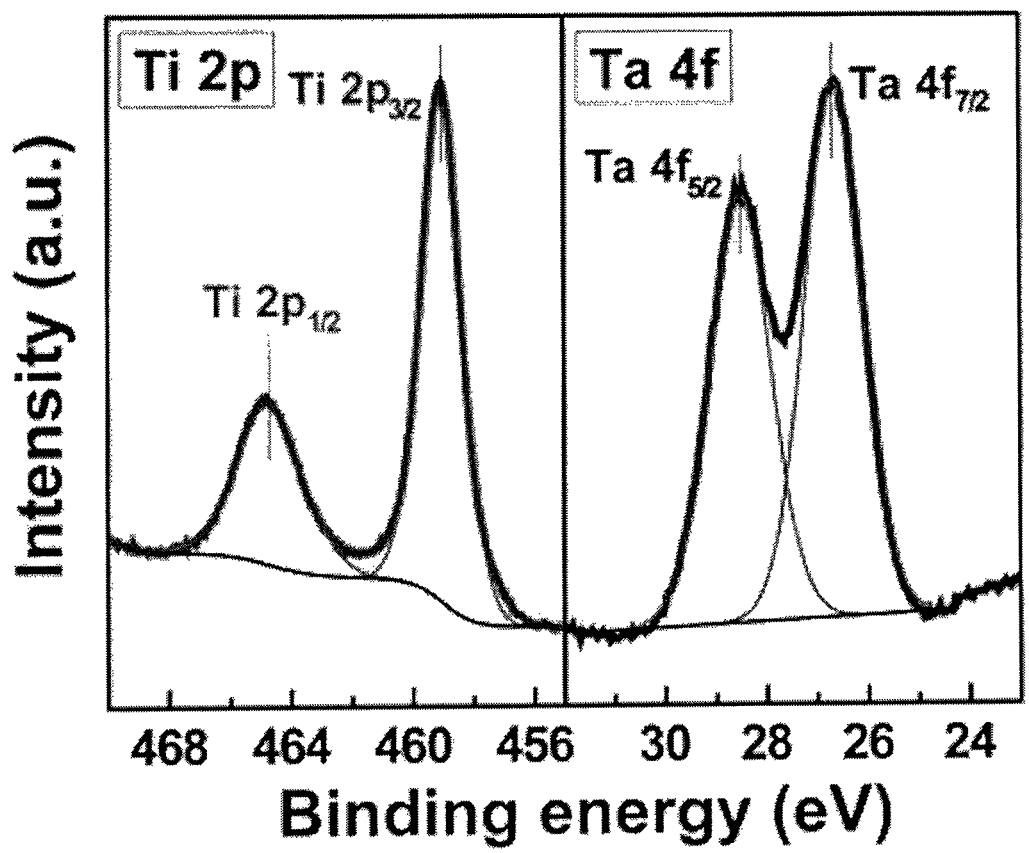
FIG. 6 is a graph depicting XPS spectra of an interface oxide layer of a selection device for a non-volatile memory in accordance with one embodiment of the present invention.

FIG. 6 is a graph depicting XPS spectra of an interface oxide layer of a selection device for a non-volatile memory in accordance with one embodiment of the present invention.

Referring to FIG. 6, since Ta peaks were detected together with Ti peaks in the TiO$_2$ layer, it can be seen that some of Ta$^{5+}$ ions in the interface between the TaO$_x$ layer and the TiO$_2$ layer were supplied to the TiO$_2$ layer. On the periodic table, since Ta (atomic radius: 146 pm) is near Ti (atomic radius: 140 pm), Ta can easily diffuse into the TiO$_2$ layer. Hence, the TiO$_2$ layer was formed in the TiO$_2$ layer by doping of Ta ions so as to adjoin the TaO$_x$ layer, whereby the thickness of the TiO$_2$ layer having insulating properties can be reduced.

Figure 7:
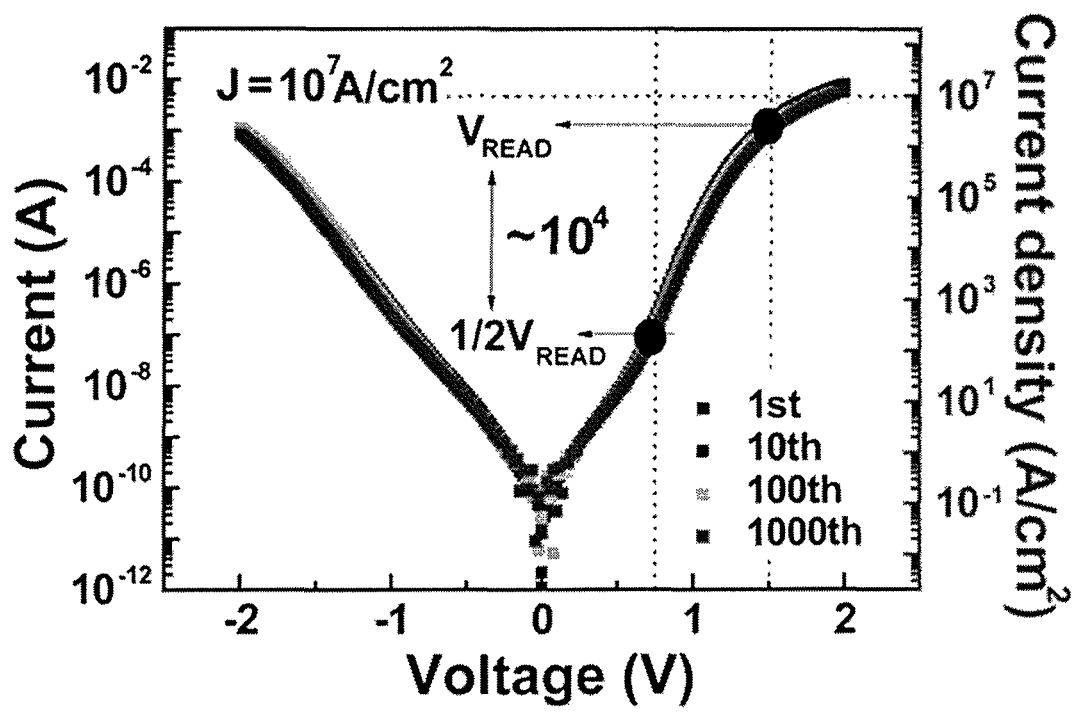
FIG. 7 is a current-voltage (I-V) curve depicting current density and selection ratio of a selection device for a non-volatile memory in accordance with one embodiment of the present invention.

FIG. 7 is a current-voltage (I-V) curve depicting current density and selection ratio of a selection device for a non-volatile memory in accordance with one embodiment of the present invention. Here, read voltage (V$_{read}$) was 1.5V and ½ read voltage (½V$_{read}$) was 0.75V.

Referring to FIG. 7, the selection device had a selection ratio of about 10$^4$ at the read voltage (V$_{read}$) and the ½ read voltage (½V$_{read}$). The selection device had a maximum on-current density of 10$^7$ A/cm$^2$ at 1.8V and a maximum on-current density of 3.2×10$^7$ A/cm$^2$ at 2.5V. For example, a selection device having a size of 10 nm×10 nm is operated at an electric current of 10 µA, which may be a sufficient current to allow set/reset operation of the resistive random access memory. As such, it can be confirmed that the selection device according to the embodiment has a high selection ratio and a sufficient on-current density to record program data in the memory.

Figure 8:
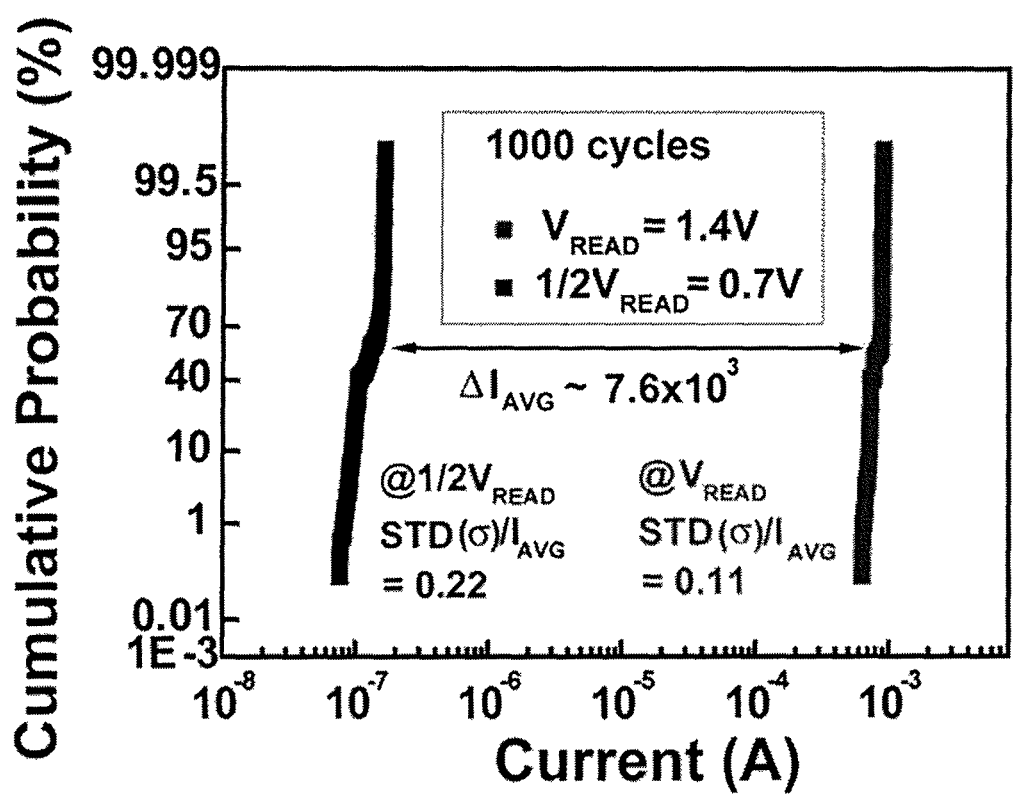
FIG. 8 is a graph depicting a cumulative probability according to electric current of a selection device for a non-volatile memory in accordance with one embodiment of the present invention.

FIG. 8 is a graph depicting a cumulative probability according to electric current of a selection device for a non-volatile memory in accordance with one embodiment of the present invention. Here, read voltage V$_{read}$ was 1.4V and ½ read voltage ½V$_{read}$ was 0.7V.

Referring to FIG. 8, it can be confirmed that a cumulative probability line of current at the read voltage V$_{read}$ and the ½ read voltage ½V$_{read}$ is substantially constant in the course of DC measurement over 1000 times. In other words, when a certain voltage was repeatedly applied to the device, there was substantially no change in measured electric current. With this result, it can be seen that the selection device has good current-voltage uniformity, thereby providing reliable device characteristics.

Figure 9:
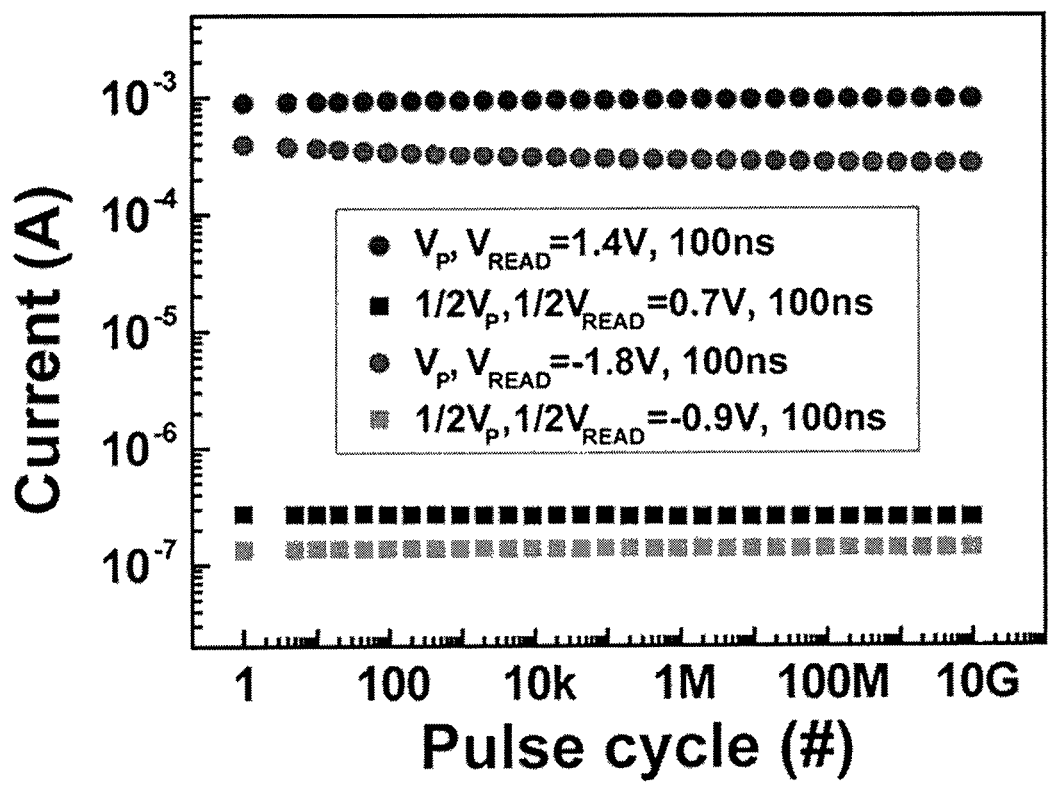
FIG. 9 is a graph depicting current according to a pulse cycle of a selection device for a non-volatile memory in accordance with one embodiment of the present invention.

FIG. 9 is a graph depicting current according to a pulse cycle of a selection device for a non-volatile memory in accordance with one embodiment of the present invention. Here, pulse read voltages (V$_p$, V$_{read}$) were 1.4V and −1.8V, and ½ pulse read voltages (½V$_p$, ½V$_{read}$) were 0.7V and −0.9V, respectively.

Referring to FIG. 9, it can be confirmed that even when pulses were supplied to the selection device at an interval of 100 ns, there was no substantial change in electric current for 10$^{10}$ cycles. With this result, it can be seen that the selection device has good pulse durability, thereby providing reliable device characteristics.

Figure 10:
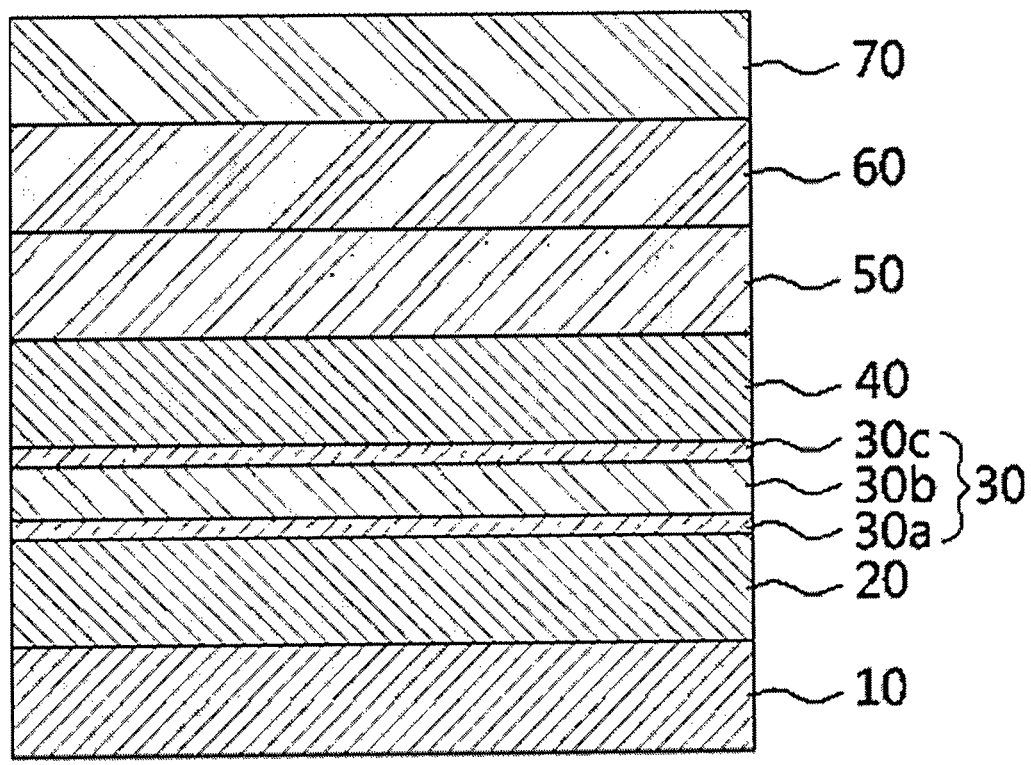
FIG. 10 is a sectional view of a unit memory cell in accordance with one embodiment of the present invention.

FIG. 10 is a sectional view of a unit memory cell in accordance with one embodiment of the present invention.

The unit memory cell according to this embodiment includes a selection device and a resistive random access memory device electrically connected to the selection device and including a resistance change layer 60.

Referring to FIG. 10, a first electrode 10, a first metal cluster oxide layer 20, a first interface oxide layer 30a, an insulating oxide layer 30b, a second interface oxide layer 30c, second metal cluster oxide layer 40 and a second electrode 50 are the same as those of the selection device shown in FIG. 1, and thus detailed descriptions thereof will be omitted.

The resistance change layer 60 is disposed on the second electrode 50. Accordingly, the second electrode 50 may act as a middle electrode.

In the resistance change layer 60, a conductive filament path may be created or extinguished according to voltage applied thereto, causing resistance change. The resistance change layer 60 may be a binary metal oxide layer or a perovskite layer. The binary metal oxide layer may be a TiO$_2$, NiO, HfO$_2$, SiO$_2$, ZrO$_2$, Al$_2$O$_3$, Y$_2$O$_3$, Ta$_2$O$_5$ or Nb$_2$O$_5$ layer, and the perovskite layer may be a SrTiO$_3$, Nb-doped SrTiO$_3$, Cr-doped SrTiO$_3$, BaTiO$_3$, LaMnO$_3$, SrMnO$_3$ or PrTiO$_3$ layer. Further, the perovskite layer may include Pr$_{1-x}$ Ca$_x$MnO$_3$ (0≤x≤1) or La$_{1-x}$Ca$_x$MnO$_3$ (0≤x≤1). However, the present invention is not limited thereto, and any typical material used for the resistance change layer of the resistive random access memory device may also be used.

The unit memory cell according to this embodiment may further include a third electrode 70.

The third electrode 70 may be formed of at least one material selected from Pt, Au, Al, Cu, Ti, W, alloys thereof, and nitrides including TiN or WN. However, the present invention is not limited thereto, and any typical material used for the resistive random access memory device may also be used.

Figure 11:
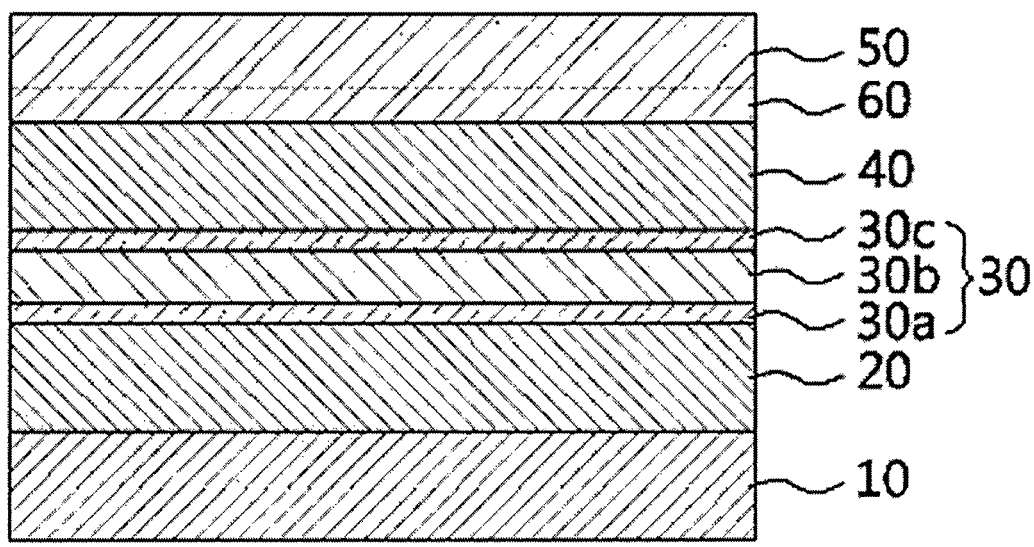
FIG. 11 is a sectional view of a unit memory cell in accordance with another embodiment of the present invention.

FIG. 11 is a sectional view of a unit memory cell in accordance with another embodiment of the present invention Referring to FIG. 11, a first electrode 10, a first metal cluster oxide layer 20, a first interface oxide layer 30a, an insulating oxide layer 30b, a second interface oxide layer 30c and a second metal cluster oxide layer 40 are the same as those of the selection device shown in FIG. 1, and detailed description thereof will be omitted.

The second electrode 50 is disposed on the second metal cluster oxide layer 40. The second electrode 50 may be a reactive metal electrode. The second electrode 50 may exhibit excellent reactivity with oxygen. Thus, the second electrode 50 may be oxidized according to voltage applied to the device to form a reactive metal oxide, which can be reduced into a reactive metal.

The second electrode 50 may contain a metal which has an electronegativity of 1.0 to 1.5 eV. For example, the second electrode 50 may contain a rare-earth metal. The rare-earth metal may be selected from the group consisting of La, Ce, Pr, Nd, Pm, Sm, Eu, Gd, Tb, Dy, Ho, Er, Tm, Yb, and Lu.

The resistance change layer 60 may be formed at an interface between the metal cluster oxide layer 40 and the second electrode 50. The resistance change layer 60 may be a reactive metal oxide layer.

For example, when a reference voltage is applied to the first electrode 10 and a positive voltage is applied to the second electrode 50, oxygen ions (O$^2$) of the second metal cluster oxide layer 40 are moved to the second electrode 50. As a result, the second electrode 50 is oxidized at the interface with the second metal cluster oxide layer 40 to form a reactive metal oxide layer thereon. Thus, the unit memory cell may have high resistance.

On the contrary, when a reference voltage is applied to the first electrode 10 and a negative voltage is applied to the second electrode 50, oxygen ions (O$^2$) are moved from the interface between the second electrode 50 and the second metal cluster oxide layer 40 to the second metal cluster oxide layer 40. As a result, the reactive metal oxide layer is reduced and the unit memory cell has low resistance.

In other words, when the second electrode 50 is the reactive metal electrode, the unit memory cell may act as both the selection device and the resistive random access memory device according to voltage applied thereto without including a separate resistance change layer.

Figure 12:
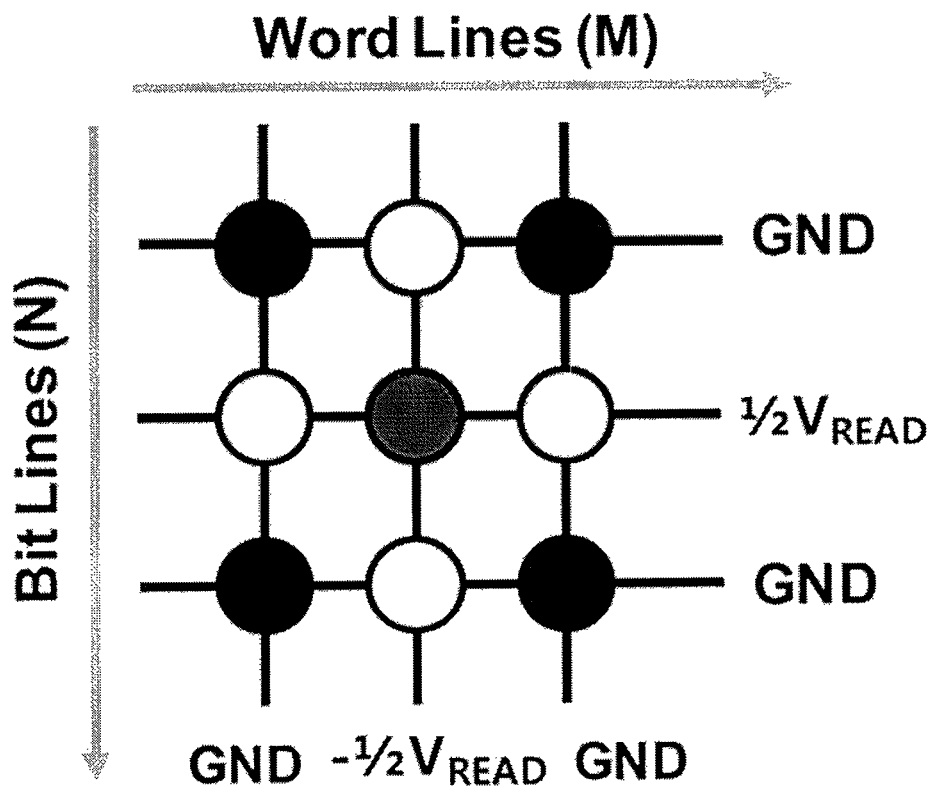
FIG. 12 is a schematic diagram illustrating read operation of a resistive random access memory array including unit memory cells in accordance with one embodiment of the present invention.

FIG. 12 is a schematic diagram illustrating a reading operation of a resistive random access memory array including unit memory cells in accordance with one embodiment of the present invention.

Referring to FIG. 12, ½ read voltage ½ V$_{read}$ is applied to a selected word line and ground voltage GND is applied to non-selected word lines. In addition, −½ read voltage −½ V$_{read}$ is applied to a selected bit line and ground voltage GND is applied to non-selected bit lines.

As a result, the read voltage V$_{read}$ is applied to a unit memory cell between the selected word line and the selected bit line, so that electric current corresponding to data stored in the unit memory cell flows in the selected word line.

On the contrary, the ±½ read voltage ±½ V$_{read}$ is applied to a unit memory cell between the selected word line and the non-selected bit lines and to a unit memory cell between the selected bit line and non-selected word lines. Further, the voltage is not applied to other unit memory cells except for these unit memory cells.

Then, data stored in the unit memory cell to which the read voltage V$_{read}$ is applied can be read by sensing the current of the selected bit line.

Figure 13:
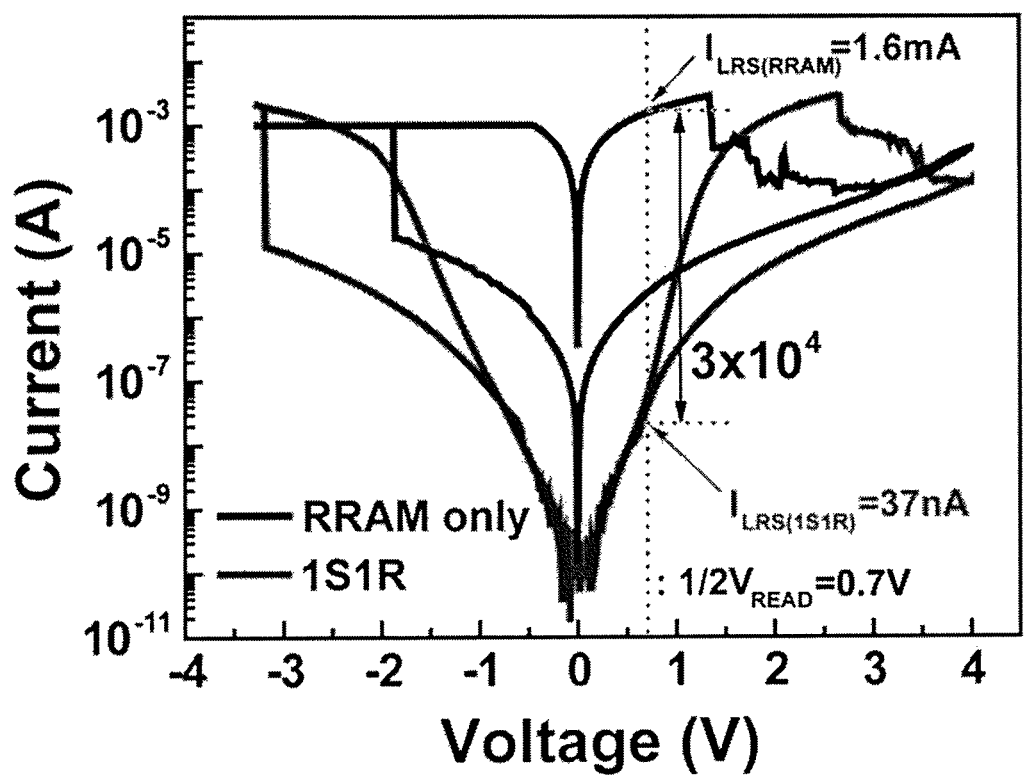
FIG. 13 is a current-voltage (I-V) curve of a unit memory cell (1S1R) in accordance with one embodiment of the present invention.

FIG. 13 is a current-voltage (I-V) curve of a unit memory cell (1S1R) in accordance with one embodiment of the present invention. Here, read voltage (V$_{read}$) is 1.4V and ½ read voltage (½V$_{read}$) is 0.7V.

Figure 14:
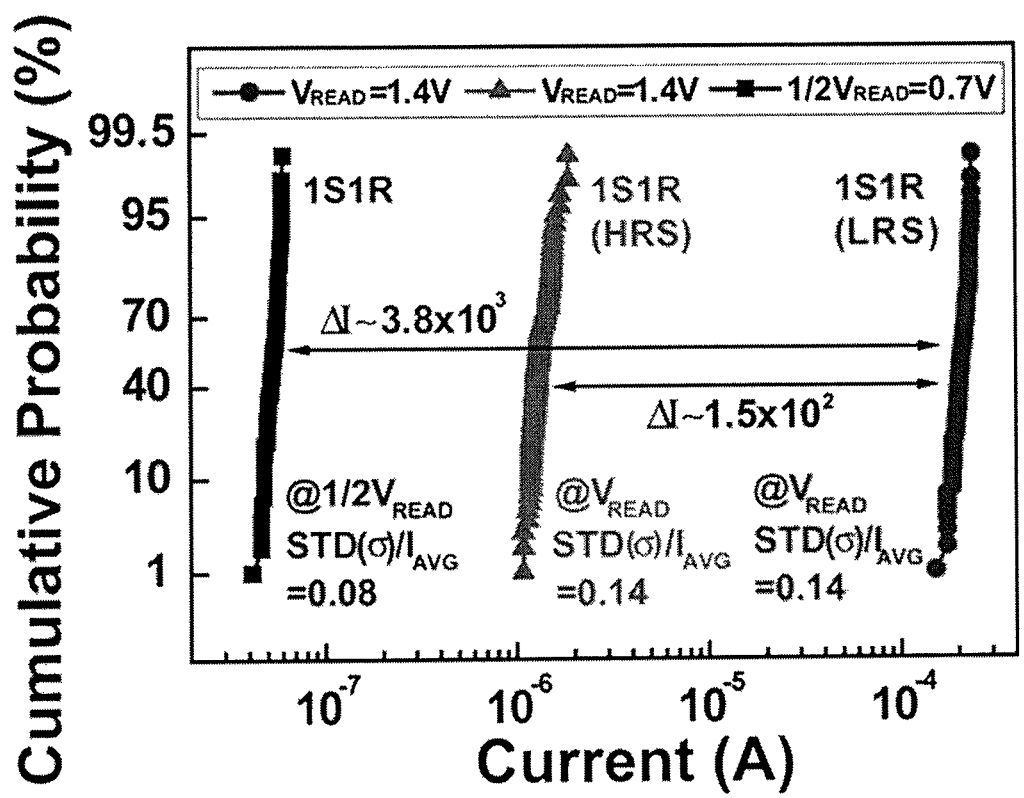
FIG. 14 is a graph depicting a cumulative probability according to electric current of a unit memory cell (1S1R) in accordance with one embodiment of the present invention.

FIG. 14 is a graph depicting a cumulative probability according to electric current of a unit memory cell (1S1R) in accordance with one embodiment of the present invention. Read voltage V$_{read}$ is 1.4V and ½ read voltage ½V$_{read}$ is 0.7V. Here, the read voltage (V$_{read}$) is −1.4V in LRS and 1.4V in HRS, and ½ read voltage ½V$_{read}$ is 0.7V.

Figure 15:
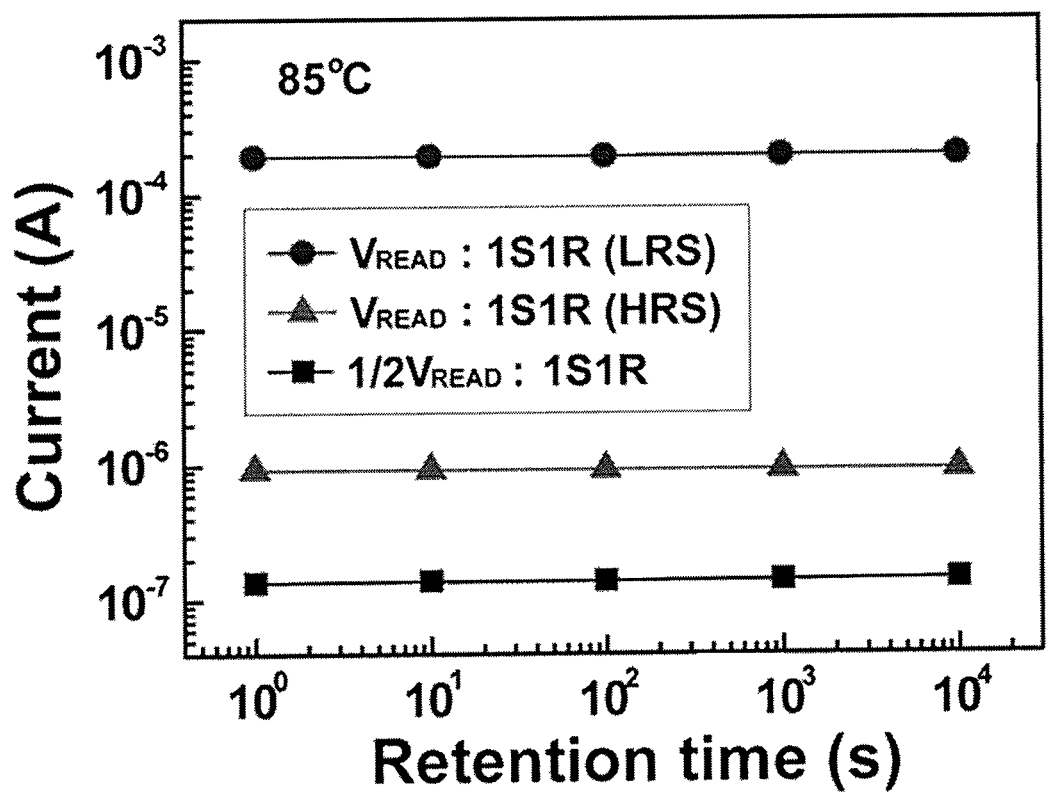
FIG. 15 is a graph depicting retention characteristics of a unit memory cell (1S1R) in accordance with one embodiment of the present invention.

FIG. 15 is a graph depicting retention characteristics of a unit memory cell (1S1R) in accordance with one embodiment of the present invention.

The resistive random access memory devices used in FIGS. 13 to 15 are formed by depositing a Cu-doped HfO$_2$ thin film as a resistance change layer on a Pt lower electrode, followed by depositing a W upper electrode.

Referring to FIGS. 12 and 13, comparing the unit memory cell (1S1R) including the selection device with a resistive random access memory (RRAM only) which does not includes the selection device, the unit memory cell exhibits low electric current in a low voltage range from −0.7V to 0.7V. As a result, it is possible to suppress current leakage in this voltage range.

On the other hand, the resistive random access memory which does not include the selection device has an electric current O$_{LRS(RRAM)}$ of 1.6 mA in a low resistance state at ½ read voltage ½V$_{read}$, whereas the unit memory cell including the selection device has an electric current I$_{LRS(1S1R)}$ of 37 nA in a low resistance state at ½ read voltage ½V$_{read}$.

Thus, as shown in FIG. 13, it can be seen that, in the resistive random access memory array constituted by unit memory cells according to the present invention, current leakage from a unit memory cell to which the ±½read voltage ±½ V$_{read}$ is applied is about 1/(3×10$^4$) times or less that of the resistive random access memory array constituted only by resistance random access memories.

Referring to FIG. 14, it can be seen that the cumulative probability line of electric current at read voltage V$_{read}$ in a high resistance state (HRS) and a low resistance state (LRS) is coincident with the cumulative probability line of electric current at ½ read voltage ½V$_{read}$. In other words, even in the case of repeated application of a certain voltage, there is no substantial change in measured electric current. From this result, it can be seen that the unit memory cell according to the present invention exhibits excellent resistance switching characteristics.

Referring to FIG. 15, since the electric current is substantially constant at 85° C. for 10$^4$ seconds, it can be seen that the unit memory cell according to the present invention exhibits excellent retention characteristics.

As such, according to the present invention, the selection device for a non-volatile memory includes an interface oxide layer placed inside a tunneling oxide layer and formed by doping of a metal contained in a metal cluster oxide layer into the tunneling oxide layer to adjoin the metal cluster oxide layer. With this configuration, the selection device has a high on-current density of about $10^7$ A/cm² at a relatively low voltage of about 2V. In addition, the metal cluster oxide layer serves as an internal resistor, thereby improving device durability.

Further, since the selection device for a non-volatile memory according to the present invention has a high selection ratio of about $10^4$ or more, unit memory cells, each of which includes a resistive random access memory electrically connected to the selection device, can be integrated into a high integration memory array by reducing sneak path current which flows in a non-selected adjacent memory cell.

Furthermore, in the method of fabricating a selection device for a non-volatile memory, the tunneling oxide layer having excellent insulating characteristics may be formed by atomic layer deposition, and the oxygen vacancy density of the metal cluster oxide layer can be controlled through heat treatment of a metal layer after deposition of the metal layer.

Although some exemplary embodiments have been described herein, it should be understood by those skilled in the art that these embodiments are given by way of illustration only, and that various modifications, variations and alterations can be made without departing from the spirit and scope of the invention. The scope of the present invention should be defined by the appended claims and equivalents thereof.

What is claimed is:

1. A unit memory cell comprising:
   a first electrode;
   a second electrode, wherein the second electrode is a reactive metal electrode;
   a tunneling oxide layer interposed between the first electrode and the second electrode;
   a first metal cluster oxide layer interposed between the tunneling oxide layer and the second electrode, and
   wherein the tunneling oxide layer comprises an insulating oxide layer, and an interface oxide layer formed by doping of a metal contained in the first metal cluster oxide layer into the tunneling oxide layer to adjoin the first metal cluster oxide layer.

2. The unit memory cell according to claim 1, wherein the interface oxide layer is an oxide layer into which a metal having a different valence electron number than the metal contained in the tunneling oxide layer is diffused.

3. The selection device according to claim 1, wherein the insulating oxide layer has a higher work function than the first metal cluster oxide layer or the same work function as that of the first metal cluster oxide layer.

4. The unit memory cell according to claim 1, wherein the tunneling oxide layer contains $TiO_2$, $Al_2O_3$ or $HfO_2$.

5. The unit memory cell according to claim 1, wherein the first metal cluster oxide layer contains $TaO_x$, $TiO_x$ or $HfO_x$ ($0.1 \leq X \leq 1$).

6. The unit memory cell according to claim 1, wherein the tunneling oxide layer contains $TiO_2$, and the first metal cluster oxide layer contains $TaO_x$ ($0.1 \leq X \leq 1$).

7. The unit memory cell according to claim 1, further comprising:
   a second metal cluster oxide layer disposed between the tunneling oxide layer and the first electrode.

8. A unit memory cell comprising:
   a selection device comprising a tunneling oxide layer, and a metal cluster oxide layer on the tunneling oxide layer; and
   a resistive random access memory device electrically connected to the selection device and comprising a resistance change layer and a reactive metal electrode on the metal cluster oxide layer.

9. The unit memory cell according to claim 8, wherein the reactive metal electrode contains a metal having an electronegativity of 1.0 to 1.5 eV.

10. The unit memory cell according to claim 8, wherein the resistance change layer is formed at an interface between the metal cluster oxide layer and the reactive metal electrode.

* * * * *